(12) United States Patent
Tsai et al.

(10) Patent No.: US 11,881,421 B2
(45) Date of Patent: Jan. 23, 2024

(54) SEMICONDUCTOR DIE CARRIER STRUCTURE

(71) Applicant: Taiwan Semiconductor Manufacturing Co., Ltd., Hsinchu (TW)

(72) Inventors: Tzu-Chung Tsai, Hsinchu (TW); Ping-Cheng Ko, Hsinchu (TW); Fang-yu Liu, Hsinchu (TW); Jhih-Yuan Yang, Hsinchu (TW)

(73) Assignee: Taiwan Semiconductor Manufacturing Co., Ltd., Hsicnhu (TW)

( * ) Notice: Subject to any disclaimer, the term of this patent is extended or adjusted under 35 U.S.C. 154(b) by 0 days.

(21) Appl. No.: 17/216,247

(22) Filed: Mar. 29, 2021

(65) Prior Publication Data
US 2021/0217642 A1 Jul. 15, 2021

Related U.S. Application Data

(62) Division of application No. 16/448,467, filed on Jun. 21, 2019, now Pat. No. 10,964,569.
(Continued)

(51) Int. Cl.
*H01L 21/673* (2006.01)
*B29C 45/72* (2006.01)
(Continued)

(52) U.S. Cl.
CPC .... *H01L 21/67386* (2013.01); *B29C 45/7207* (2013.01); *B29C 45/73* (2013.01);
(Continued)

(58) Field of Classification Search
CPC .. B29C 2035/1616; B29C 2945/76531; B29C 2945/76668; B29C 2945/76688;
(Continued)

(56) References Cited

U.S. PATENT DOCUMENTS 3,373,892 A * 3/1968 Landen .................. A45D 40/22
                                                        220/844
5,364,598 A * 11/1994 Oxley ................ G01N 35/1079
                                                         422/65
(Continued)

FOREIGN PATENT DOCUMENTS

DE 102005023655 A1 11/2006

OTHER PUBLICATIONS

Dwyer Instruments ("The Importance of Temperature Control in Plastic Injection Molding") Nov. 11, 2014 (Year: 2014).*

*Primary Examiner* — Yunju Kim
(74) *Attorney, Agent, or Firm* — Sterne, Kessler, Goldstein & Fox P.L.L.C.

(57) ABSTRACT

An apparatus having a first portion including a first front wall, a first rear wall, and a bottom wall integrally coupled to the first front wall and the first rear wall, and pivotal pin structures integrally coupled to and extending from the first rear wall. The apparatus includes a second portion having a second front wall, a second rear wall, and a top wall integrally coupled to the second front wall and the second rear wall, and pin holders integrally coupled to and extending from the second rear wall and at an offset angle with reference to the top wall. The pivotal pin structure includes a base support connected to the first rear wall and a shaft connected to the base support, and the pin holder defines an opening sized and shaped to accept the shaft. The first and second portions are sized and shaped to be pivotally movable between open and closed configurations.

20 Claims, 13 Drawing Sheets

Related U.S. Application Data

(60) Provisional application No. 62/692,357, filed on Jun. 29, 2018.

(51) Int. Cl.
| | | |
|---|---|---|
| *B29C 45/73* | (2006.01) | |
| *B29C 45/74* | (2006.01) | |
| *B29C 45/78* | (2006.01) | |
| *B29C 35/16* | (2006.01) | |
| *B29L 31/00* | (2006.01) | |
| *B29K 69/00* | (2006.01) | |

(52) U.S. Cl.
CPC .............. *B29C 45/74* (2013.01); *B29C 45/78* (2013.01); *H01L 21/67366* (2013.01); *H01L 21/67369* (2013.01); *H01L 21/67373* (2013.01); *H01L 21/67396* (2013.01); *B29C 2035/1616* (2013.01); *B29C 2945/76531* (2013.01); *B29C 2945/76668* (2013.01); *B29C 2945/76688* (2013.01); *B29C 2945/76765* (2013.01); *B29K 2069/00* (2013.01); *B29L 2031/712* (2013.01)

(58) Field of Classification Search
CPC ...... B29C 2945/76765; B29C 45/7207; B29C 45/73; B29C 45/74; B29C 45/78
See application file for complete search history.

(56) References Cited

U.S. PATENT DOCUMENTS

| | | | | |
|---|---|---|---|---|
| 5,376,317 | A * | 12/1994 | Maus | B29C 45/78 |
| | | | | 425/162 |
| 5,674,557 | A * | 10/1997 | Widman | B29C 33/56 |
| | | | | 264/2.3 |
| 5,743,409 | A | 4/1998 | Nakahara et al. | |
| 6,315,154 | B1 * | 11/2001 | Newby, Sr. | B65D 43/165 |
| | | | | 220/4.23 |
| 7,240,402 | B2 * | 7/2007 | Suzuki | A45D 40/221 |
| | | | | 16/329 |
| 10,738,935 | B2 | 8/2020 | Hsu et al. | |
| 2013/0253162 | A1 * | 9/2013 | Motoyoshi | C08G 64/06 |
| | | | | 528/201 |
| 2017/0008567 | A1 * | 1/2017 | Kim | B62D 29/004 |

* cited by examiner

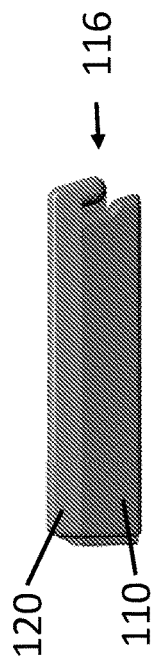
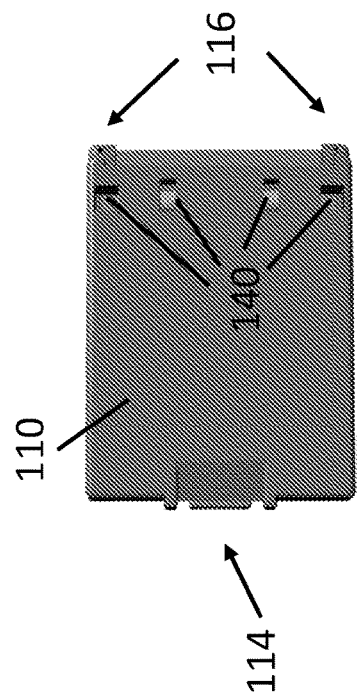
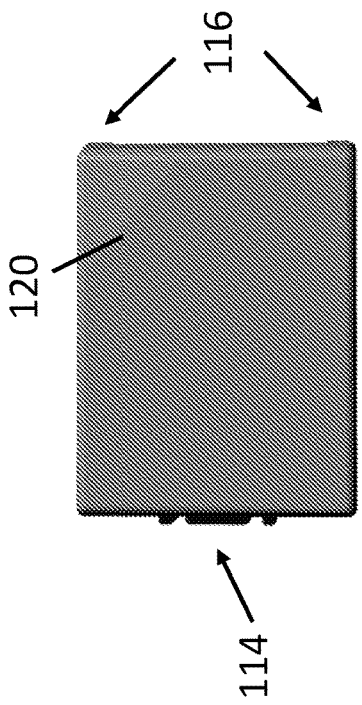
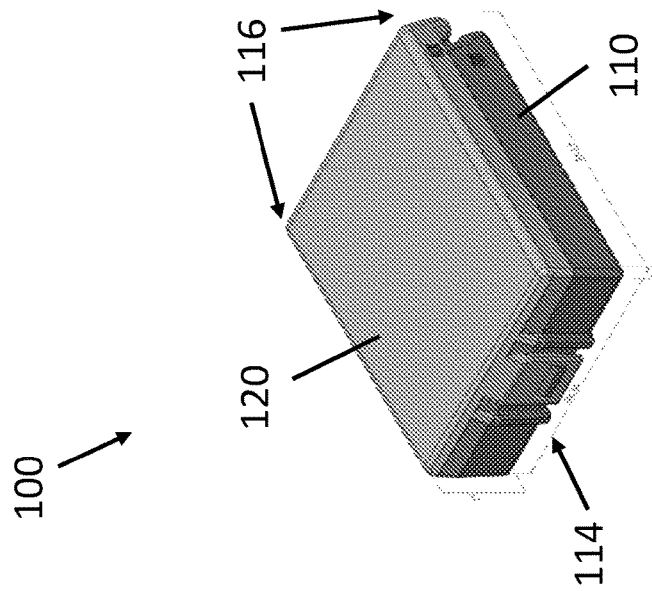

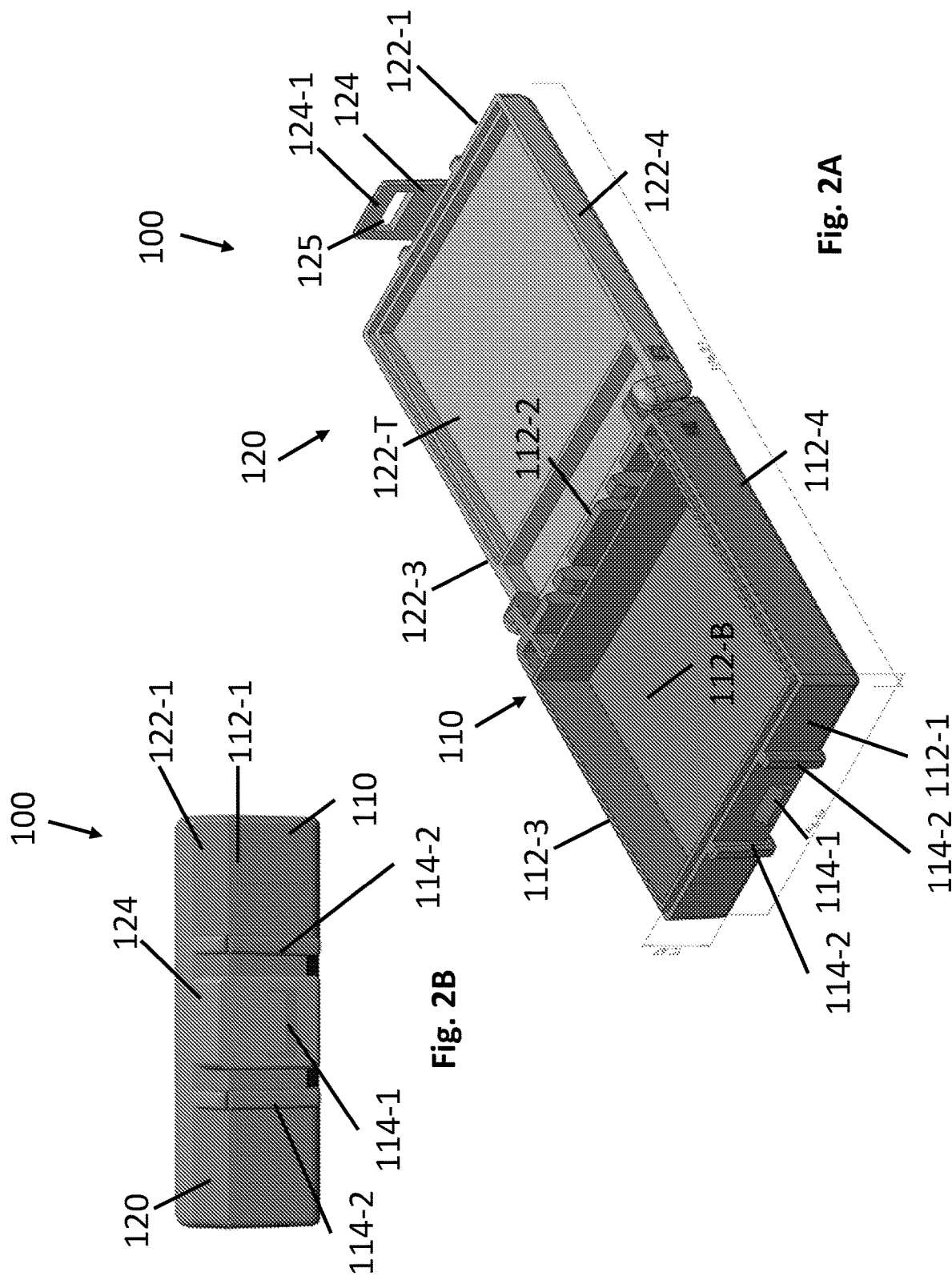

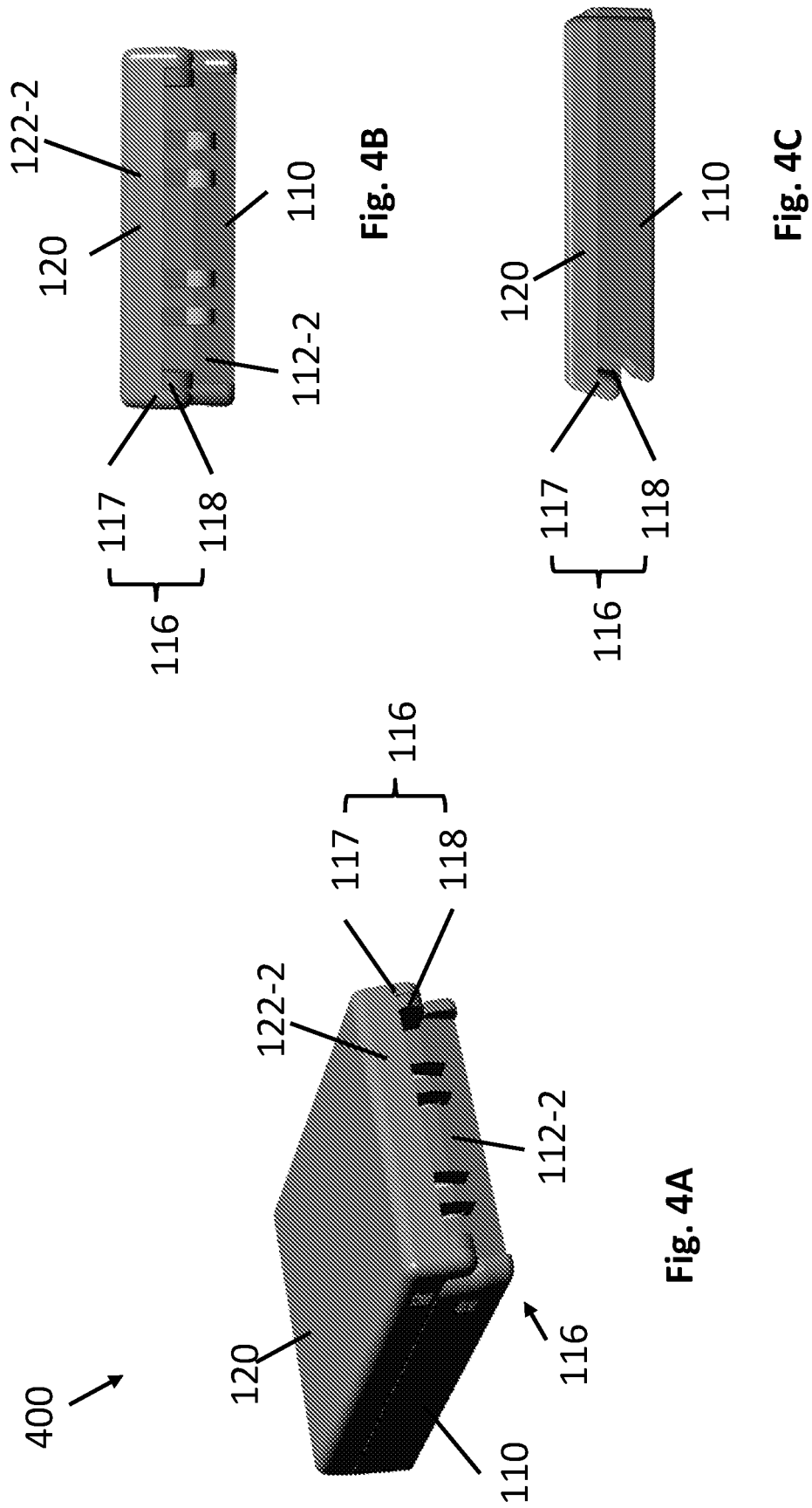

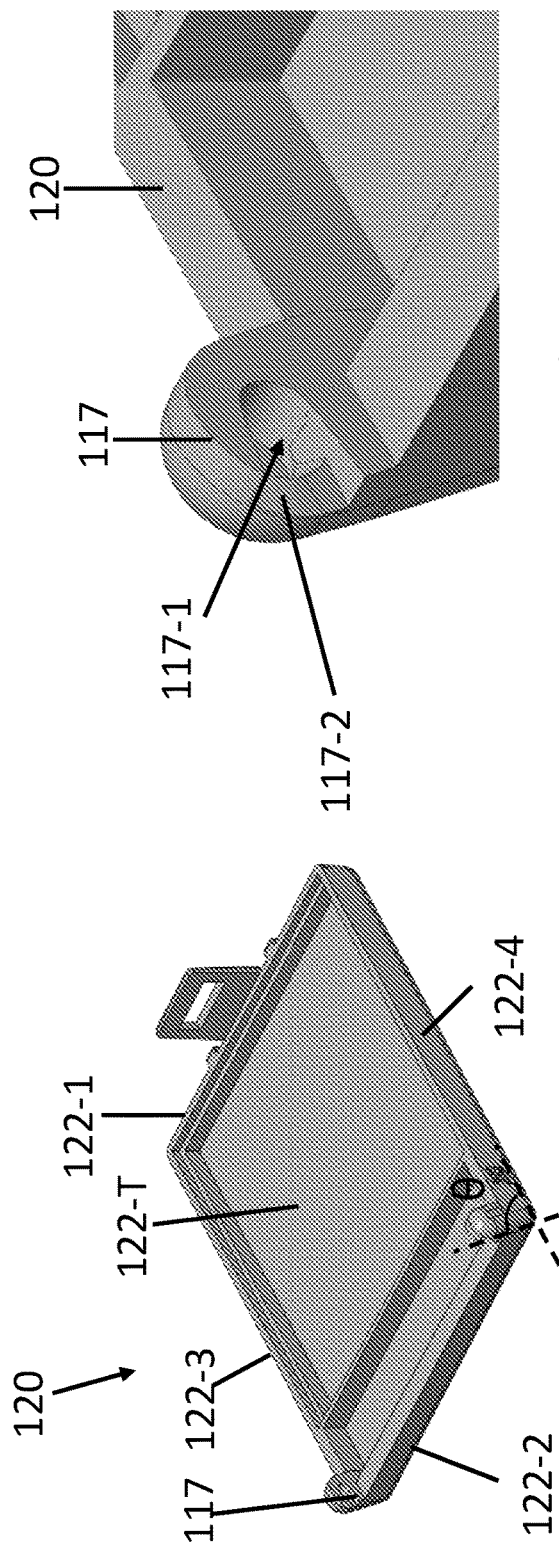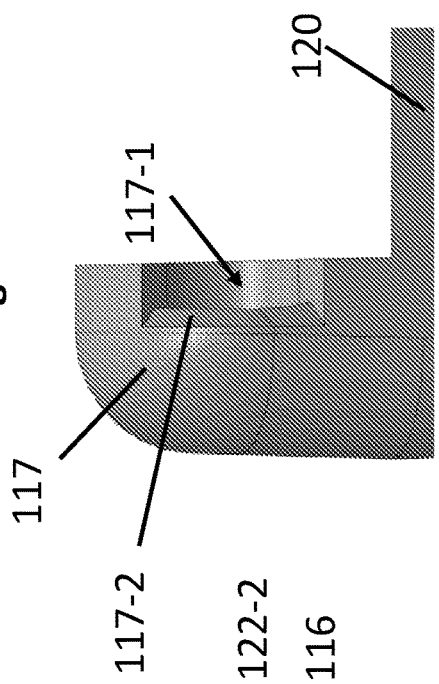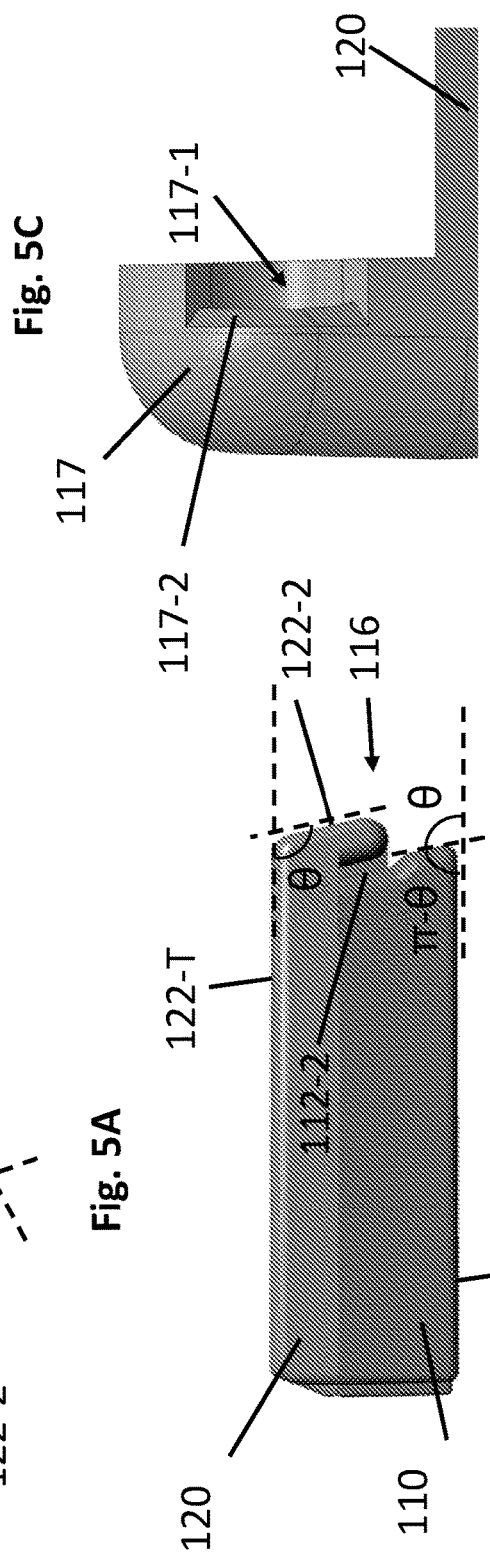
Fig. 5A
Fig. 5B
Fig. 5C
Fig. 5D

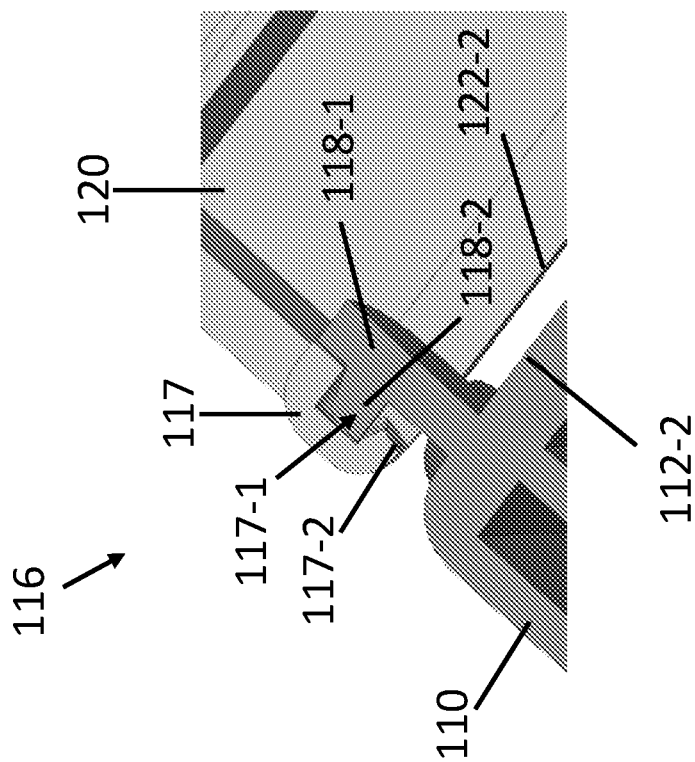
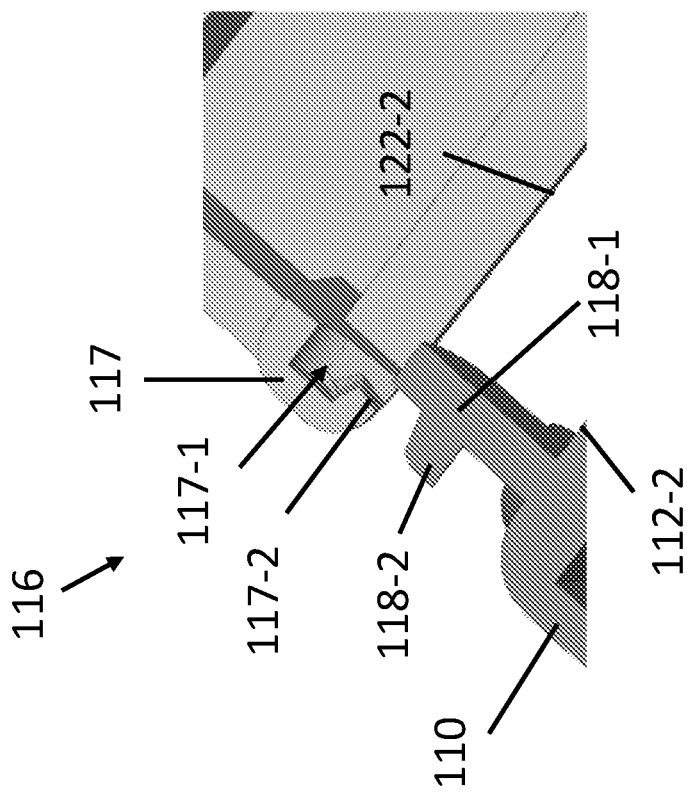
Fig. 6A
Fig. 6B

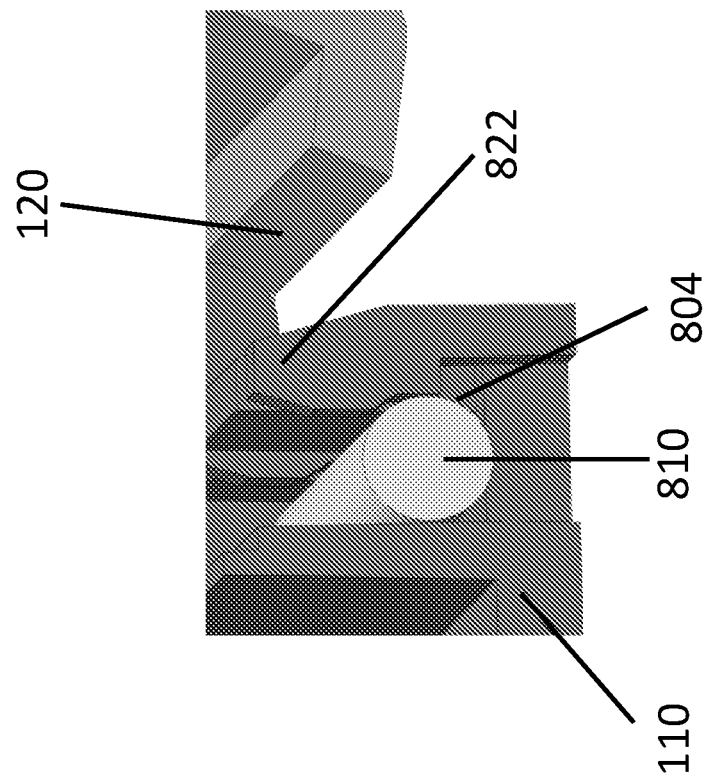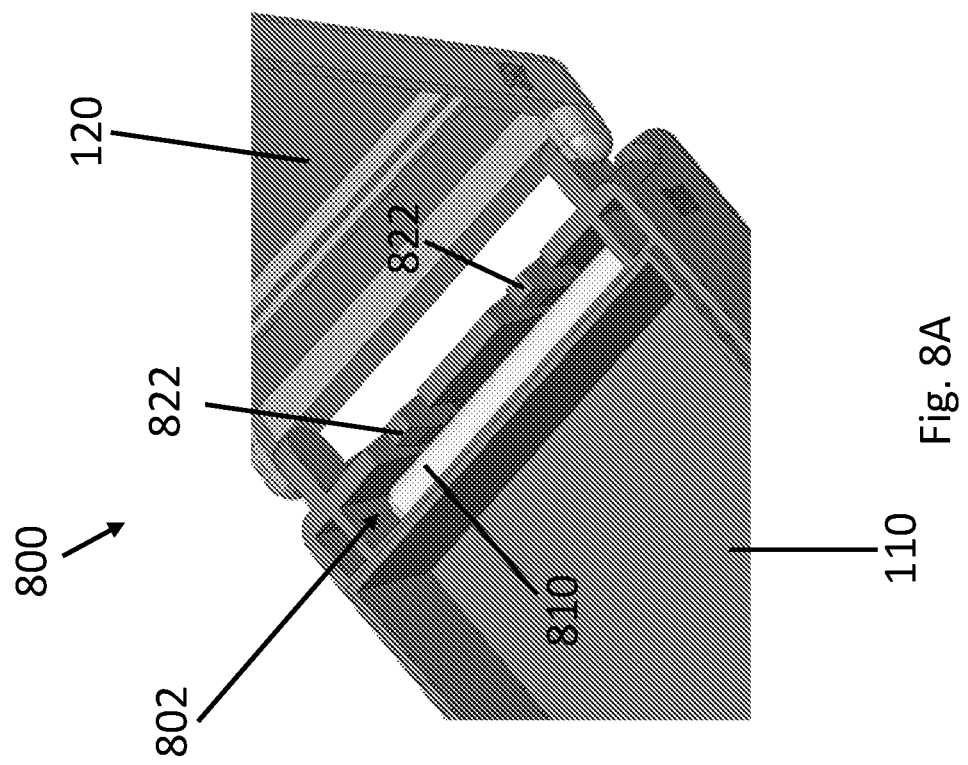

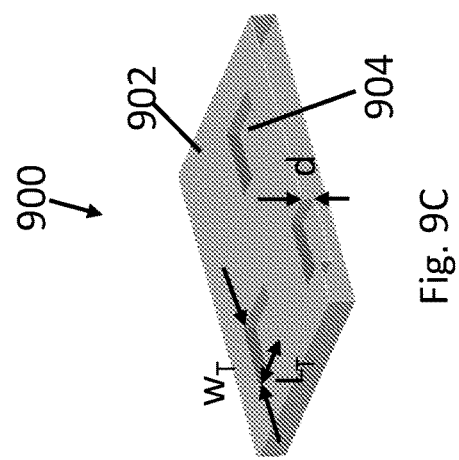
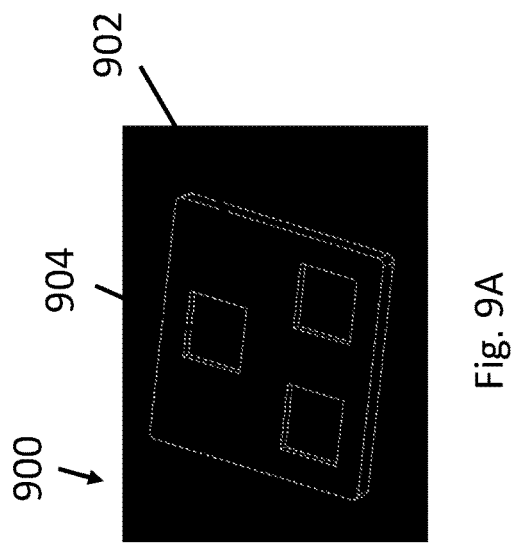
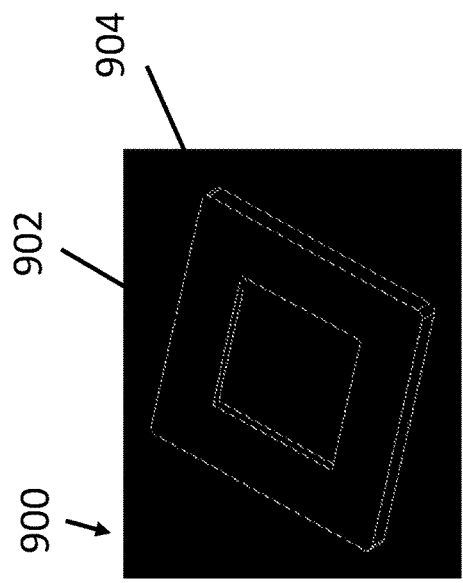
Fig. 9C
Fig. 9A
Fig. 9B

SEMICONDUCTOR DIE CARRIER STRUCTURE

CROSS-REFERENCE TO RELATED APPLICATION

This application is a divisional application of U.S. patent application Ser. No. 16/448,467, titled "Semiconductor Die Carrier Structure," which was filed on Jun. 21, 2019, which claims the benefit of U.S. Provisional Patent Application No. 62/692,357, titled "Semiconductor Die Carrier Structure," which was filed on Jun. 29, 2018, both of which are incorporated herein by reference in their entireties.

BACKGROUND

Semiconductor samples undergo numerous processing operations during fabrication process in an integrated circuit (IC) fabrication facility. Such semiconductor samples are generally packed in a container for storing, transporting, and/or shipping. Containers whose interior offers a clean room climate are therefore necessary for storing the semiconductor wafers and for transporting the semiconductor samples to various processing locations.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 1A-1D are various views of an apparatus in a closed container configuration, according to some embodiments.

FIGS. 2A-2B are various views of an apparatus respectively in an open and a closed container configuration, according to some embodiments.

FIGS. 4A-4C are various views of an apparatus in a closed container configuration, according to some embodiments.

FIGS. 5A-5D are various views of an apparatus, according to some embodiments.

FIGS. 6A-6B and 7A-7B are various views of pivot structures of an apparatus, according to some embodiments.

FIGS. 8A-8B are various views of a storage medium for one or more wireless communication devices in an apparatus in an open container configuration, according to some embodiments.

FIGS. 9A-9C are various views of padding structures of an apparatus, according to some embodiments.

DETAILED DESCRIPTION

Figure 3:
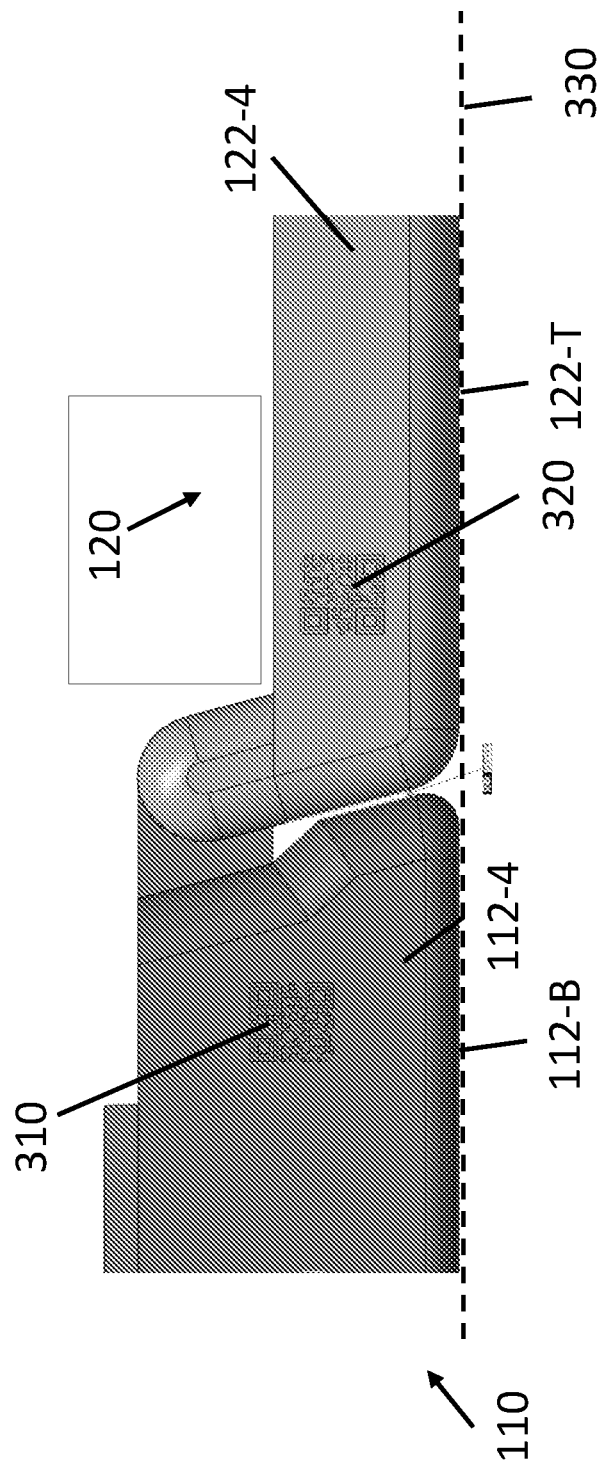
FIG. 3 is a side view of an apparatus in an open container configuration, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Semiconductor samples undergo numerous processing operations during a fabrication process in an integrated circuit (IC) fabrication facility. Such semiconductor samples are generally packed in a container for storing, transporting, and/or shipping. The container should tightly encapsulate one or more semiconductor samples and prevent the samples from physical damage or external contamination from, for example, gases, liquids, particles, and/or electrostatic charges. In addition, the interior of the container should not release any contaminating chemical substances. Therefore, there is a need of containers for sensitive semiconductor elements that provide a clean room climate for storing and transporting sensitive semiconductor elements.

Various embodiments of the present disclosure are directed to an apparatus for storing and transporting semiconductor elements and a method of making the same. References to "apparatus" made below may be understood to encompass a container, a delivery unit, an assembly, a system thereof, and the like. References to "semiconductor elements" made below may be understood to encompass any semiconductor-based samples or products, including but not limited to wafers, portions of wafers, and semiconductor devices. In some embodiments, the apparatus is a semiconductor die carrier that includes a locking mechanism, such as a latch positioned between two adjacent bumpers protruding from a front surface of a closed semiconductor die carrier. The latch can include a catch structure positioned on a top portion (e.g., a cover) of the semiconductor die carrier and a beveled trapezoidal-shaped edge positioned on a bottom portion (e.g., a base) of the semiconductor die carrier. In some embodiments, the semiconductor die carrier can include a pair of partially-recessed pivotal pin structures positioned at a rear wall of the semiconductor die carrier opposing the latch. In some embodiments, the semiconductor die carrier can include one or more storage medium, such as slots within the enclosed space formed by the top and bottom portions of the semiconductor die carrier. The storage medium can include one or more grooves configured to securely hold one or more wireless communication devices. In some embodiments, the semiconductor die carrier can include silicone pad and sponges positioned in the bottom portion of the semiconductor die carrier for holding semiconductor dies having various sizes. In some embodiments, the semiconductor die carrier can include openings, such as drain holes at the bottom portion, for draining liquids and to facilitate cleaning of the semiconductor die carrier. In some embodiments, the top and bottom portions of the semiconductor die carrier can be formed using suitable polycarbonate composites that reduce the release of chemical contamination into the enclosed space and provides improved electrical and mechanical properties of the semiconductor die carrier. In some embodiments, the top and bottom portions of the semiconductor die carrier is manufactured by an injection molding apparatus. The manufacturing process provides a heating process where different portions of the mold injection barrel are heated to different temperatures. The manufacturing process also provides a cooling process where the mold-inject formed top or bottom portion is cooled down gradually in a controlled manner. Such heating and cooling process can provide improved electrical and mechanical properties by eliminating imperfections (e.g., particles, voids, or air bubbles) in the top and bottom portions. In some embodiments, the semiconductor die carrier can also include imprinted barcodes (e.g., two-dimensional matrix barcodes) on its exterior to identify information related to the semiconductor elements stored within the semiconductor die carrier.

In accordance with various embodiments of this disclosure, the apparatus described in the present disclosure provides, among other things, benefits such as (i) improved physical damage prevention due to protected latch and partially-recessed pivotal pin structures; (ii) improved protection for enclosed wireless communication devices due to an enclosed and grooved storage slots positioned between top and bottom portions of the semiconductor; (iii) reduced manufacturing cost due to silicone and sponge pads that allow semiconductor dies with various sizes to be securely placed inside the semiconductor die carrier; (iv) improved protection from electrostatic charges and physical damage due to improved polycarbonate material that forms the semiconductor die carrier; and (v) convenient information read due to imprinted barcodes located on the exterior surface of the semiconductor die carrier.

FIGS. 1A-1D are various views of an apparatus 100 in a closed container configuration, according to some embodiments. In some embodiments, a closed container configuration can be a position of apparatus 100 where a top portion and a bottom portion of apparatus 100 are engaged in a releasably locked configuration through a latch. FIG. 1A is a perspective view of apparatus 100. FIG. 1B is a side view of apparatus 100. FIG. 1C is a bottom view of apparatus 100. FIG. 1D is a plan view of apparatus 100. Apparatus 100 can be a semiconductor die carrier structure that includes two body portions. For example, apparatus 100 can include a top portion 120 and a bottom portion 110 that have matching edges to form an interlocking structure in the closed container configuration as shown in FIGS. 1A-1D. Apparatus 100 includes a latch 114 positioned on a front wall of apparatus 100 and a pair of pivots 116 positioned on a rear wall of apparatus 100 opposing the front wall. As illustrated in FIG. 1C, apparatus 100 also includes a plurality of openings 140 located on a bottom surface of bottom portion 110. The plurality of openings 140 can be used as drainage holes for draining liquids.

FIG. 2A is a perspective view of an apparatus 100 in an open container configuration, according to some embodiments. In some embodiments, an open container configuration can be a position of apparatus 100 where its latch is disengaged and a top surface of the top portion and a bottom surface of the bottom portion of apparatus 100 are substantially in the same geometrical plane, such as the configuration illustrated in FIG. 2A. The storage compartment can be accessed (e.g., by a user) within apparatus 100 to place or retrieve semiconductor samples in the open container configuration. In some embodiments, apparatus 100 can be in other container configurations between the closed and open container configuration. For example, apparatus 100 can be in a partially open container configuration that is between the open and closed container configurations where the stored semiconductor samples are accessible (e.g., to a user). FIG. 2B is a front view of apparatus 100 in a closed container configuration, according to some embodiments. Structures illustrated in FIGS. 2A-2B that are similar to those illustrated in FIGS. 1A-1D may use the same numerals for ease of explanation; however, this repetition does not in itself dictate a relationship between the various embodiments and/or configurations discussed. Apparatus 100 illustrated in FIGS. 2A-2B further includes a projection 114-1 of latch 114 integrally connected to a first front wall 112-1 of bottom portion 110. Projection 114-1 can be a structure protruding from first front wall 112-1 and formed using any suitable shapes. In some embodiments, projection 114-1 can be formed using a beveled trapezoidal-shaped edge. A base of the trapezoidal-shaped edge can have a length between about 3 mm and about 60 mm and a width between about 4.5 mm and about 80 mm. A height of the beveled trapezoidal-shaped edge protruding from first front wall 112-1 can be between about 6 mm and 102 mm. Exemplary ratios of length, width, and height combinations of the trapezoidal-shaped edge can be about (i) 4/5/7, (ii) 7/8/10, (iii) 13/20/26, (iv) 20/26/40; or (v) 51/78/105. In some embodiments, exemplary ranges of length, width, and height combinations of the trapezoidal-shaped edge can be (i) about 0.1 to about 4/about 0.1 to about 5/about 0.1 to about 7, (ii) about 0.1 to about 7/about 0.1 to about 8/about 0.1 to about 10, (iii) about 0.1 to about 13/about 0.1 to about 20/about 0.1 to about 26, (iv) about 0.1 to about 20/about 0.1 to about 26/about 0.1 to about 40; or (v) about 0.1 to about 51/about 0.1 to about 78/about 0.1 to about 105, all in millimeters. For example, exemplary length, width, and height combinations of the trapezoidal-shaped edge can be about (i) 3.05/4.83/6.35, (ii) 6.35/7.87/9.40, (iii) 12.70/19.05/25.40, (iv) 19.05/25.40/38.10, and (v) 50.80/76.20/101.60, all in millimeters. Other suitable length, width, and height combinations can also be used. A pair of bumpers 114-2 are also integrally connected to first front wall 112-1 of bottom portion 110 and adjacent to projection 114-1. In some embodiments, bumpers 114-2 protrude further from first front wall 112-1 than projection 114-1. In some embodiments, projection 114-1 protrudes further from first front wall 112-1 than bumpers 114-2. Nonetheless, as projection 114-1 and bumpers 114-2 protrude from first front wall 112-1, bumpers 114-2 can be used to protect projection 114-1 from accidental physical contact with external objects during transportation of apparatus 100—which in turn reduces the probability of apparatus 100 being accidentally opened.

Top portion 120 and bottom portion 110 are sized and shaped to be rotatably and pivotally movable between a closed container configuration (e.g., shown in FIG. 1A) and an open container configuration (e.g., shown in FIG. 2A). Top portion 120 includes a catch structure 124 integrally connected to a second front wall 122-1. Recess 125 is formed in catch structure 124, and when apparatus 100 is in the closed container configuration, at least a portion of projection 114-1 is releasably secured inside recess 125 (as shown in FIG. 2B). In some embodiments, catch structure 124 can include a tip 124-1 that, in a closed container configuration of apparatus 100, is configured to be pulled away in a direction away from first front walls 112-1 (e.g., by a user) such as to release projection 114-1 from catch structure 124. Top portion 120 can then be rotatably moved away from bottom portion 110 so as to form a fully open configuration (FIG. 2A). Similarly, top portion 120 can be rotatably moved towards bottom portion 110, and projection 114-1 can be releasably secured inside recess 125 by pushing top portion 120 down towards bottom portion 110. The beveled-shaped edge of projection 114-1 and tip 124-1 that is formed using flexible material can provide the benefits of opening easily and better adhesion Each wall of top portion 120 and bottom portion 110 can be in a square or rectangular shape as illustrated in the drawings of the present disclosure. However, these drawings are for illustration only. Each wall of top portion 120 and bottom portion 110 can be in any other suitable shape. Two additional side walls 112-3, 112-4, 122-3, and 122-4 for respective top and bottom portions 120 and 110 can be provided and formed using any suitable geometrical shapes. For example, first and second front walls 112-1 and 122-1, and rear walls 112-2 and 122-2, can be curved and directly connected together in some embodiments. When each wall of top portion 120 and bottom portion 110 is in a square, rectangular or curved shape, each corner of apparatus 100 can have a smooth curvature. In some embodiments, a bottom wall 112-B is integrally coupled to first front wall 112-1 and first rear wall 112-2. In some embodiments, a top wall 122-T of top portion 120 is integrally coupled to second front wall 122-1 and second rear wall 122-2.

FIG. 3 is a side view of an apparatus 300 in an open container configuration, according to some embodiments. Apparatus 300 includes machine-readable identifying codes 310 and 320 formed on suitable exterior surfaces of the apparatus. For example, machine-readable identifying codes 310 and 320 can be formed on side walls 112-4 and 122-4 of bottom and top portions 110 and 120 respectively. Machine-readable identifying codes 310 and 320 can include data regions that include high-intensity features and low-intensity features. In some embodiments, the high-intensity features and low-intensity features represent binary data that can correspond to an identification of the semiconductor sample (e.g., serial number, sample name, sample type, sample attribute, or other suitable identifier) and/or other characteristics of the semiconductor sample, such as a suitable process characteristic or a performance metric. The machine-readable identifying codes 310 and 320 can also include a reference mark such as a position, alignment, or timing mark. In some embodiments, machine-readable identifying codes 310 and 320 comply with a linear code standard (e.g., a one-dimensional barcode) or matrix code standard (e.g., a two-dimensional barcode) such as United Parcel Code ("UPC"), QR Code® (a trademark of Denso Wave Inc.), Data Matrix, and/or Portable Data File 417 ("PDF417").

FIGS. 4A-4C are various views of an apparatus 400 in a closed container configuration, according to some embodiments. FIG. 4A is a perspective view of apparatus 400. FIG. 4B is a rear view of apparatus 400. FIG. 4C is a side view of apparatus 400. Apparatus 400 can be a semiconductor die carrier structure similar to apparatus 100 described above and includes two body portions (e.g., top and bottom portions). Structures illustrated in FIGS. 4A-4C that are similar to those illustrated in FIGS. 1A-1D may use the same numerals for ease of explanation; however, this repetition does not in itself dictate a relationship between the various embodiments and/or configurations discussed. Apparatus 400 illustrated in FIGS. 4A-4C further includes a pair of pivots 116 having integrally connected to a first rear wall 112-2 and a second rear wall 122-2 of bottom portion 110 and top portion 120 respectively. Each pivot 116 includes a pivotal pin structure 118 of bottom portion 110 releasably secured in a pin holder 117 of top portion 120. Each pivot 116 and its pin holder 117 and pivotal pin structure 118 are further described in detail with references to FIGS. 5A-7B below.

FIGS. 5A, 5C, and 5D are various views of a top portion (e.g., a cover) of an apparatus, according to some embodiments. FIG. 5B is a side view of an apparatus in a closed container configuration. FIG. 5A is a perspective view of top portion 120. FIGS. 5C and 5D are close up views of pin holder 117 as illustrated in FIGS. 5A-5B and also in FIGS. 4A-4C. Structures illustrated in FIGS. 5A-5D that are similar to those illustrated in FIGS. 4A-4C may use the same numerals for ease of explanation; however, this repetition does not in itself dictate a relationship between the various embodiments and/or configurations discussed. Top wall 122-T is integrally coupled to second front wall 122-1 and second rear wall 122-2. Pin holder 117 can be integrally coupled to and extend from second rear wall 122-2. For example, a pin holder 117 can protrude from the intersection of sidewall 122-4 and second rear wall 122-2, and an offset angle θ between second rear wall 122-2 and top wall 122-T (as indicated by the dashed lines in FIG. 5A) can be in a range between about −20° and about 210°. In some embodiments, offset angle θ can be between about 0° and about 273°. Similarly, bottom portion 110 can have a first rear wall 112-2 that is at an angle π-θ degrees (in correlation with offset angle θ) with reference to bottom wall 112-B. Therefore, first and second rear walls are aligned substantially in parallel with each other in open and closed container configurations. Such pivot configuration forms a pair of pivots 116 that are partially recessed without significantly protruding from the rear of the apparatus. Such configuration can provide the benefit of reducing the likelihood of damages to the pivot structure as pivots protruding from the rear of the apparatus are more likely to collide with other objects during transportation and suffer physical damage. Such configuration also provides the benefit of maintaining a substantially flat position for an open container configuration that enables easy access to contents stored within the container. For example, as illustrated in FIG. 2A and FIG. 3, top wall 122-T and bottom wall 112-B are substantially in the same geometrical plane (e.g., dashed line 330 in FIG. 3) when the apparatus is in a fully open container configuration. In addition, pin holder 117 defines an opening 117-1 sized and shaped to accept pivot 118 at an aligned position between bottom portion 110 and top portion 120. Pin holder 117 also includes an entry surface 117-2 for guiding pivot 118 into opening 117-1, as further described below with reference to FIGS. 6A-6B.

Figure 7B:
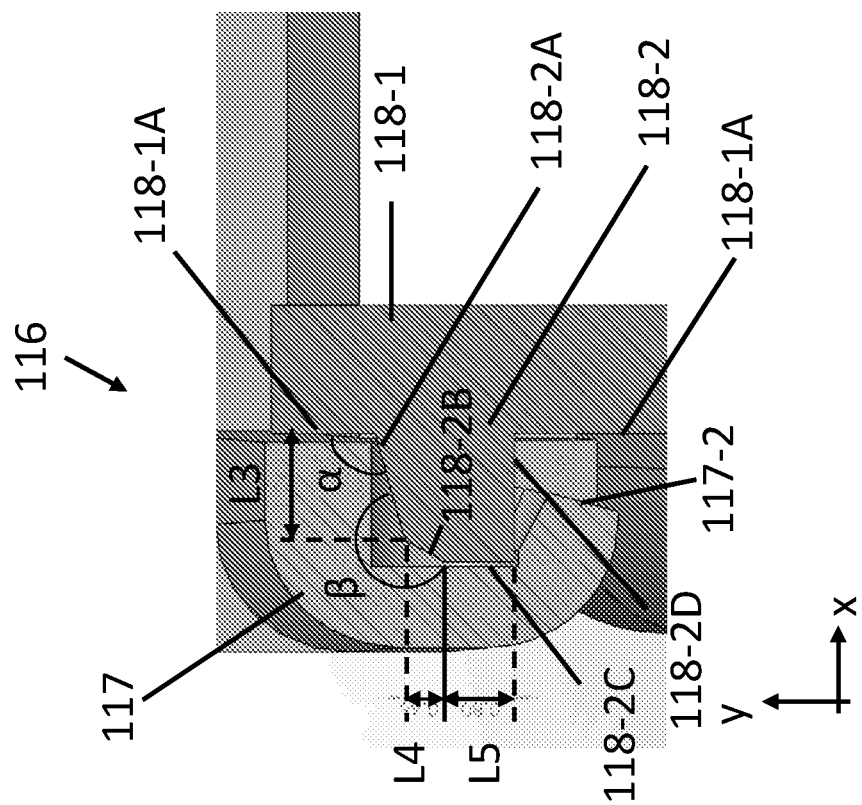
Figure 7A:
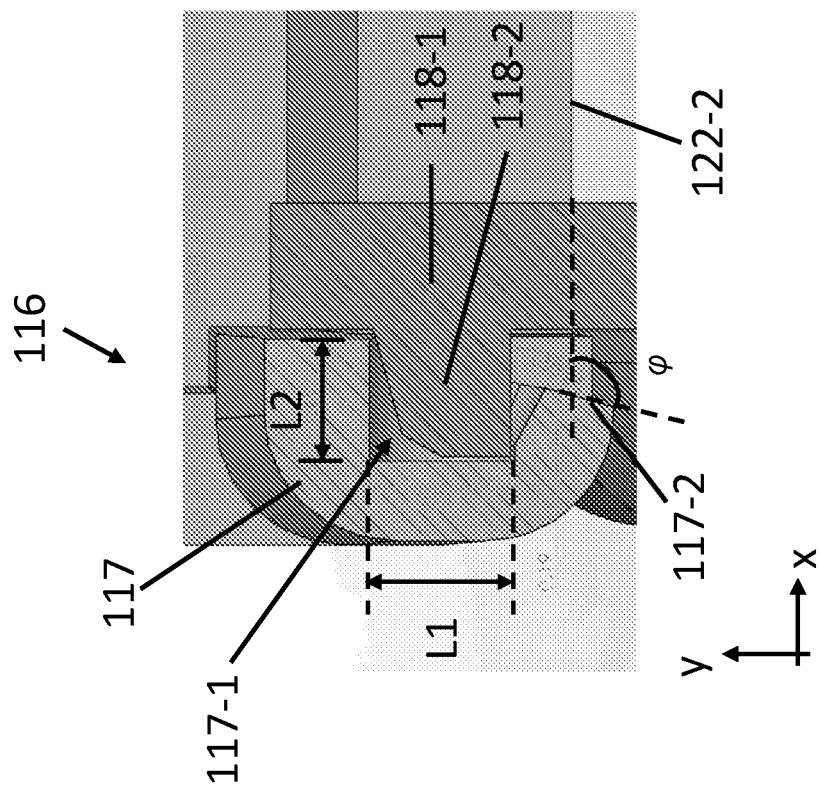

FIGS. 6A-6B are various views of top portion and bottom portion of an apparatus, according to some embodiments. FIGS. 7A-7B are various views of pivot 116 that releasably connects a top portion 120 to a bottom portion 110 of an apparatus, according to some embodiments. Structures illustrated in FIGS. 6A-7B that are similar to those illustrated in FIGS. 4A-4C may use the same numerals for ease of explanation; however, this repetition does not in itself dictate a relationship between the various embodiments and/or configurations discussed.

FIG. 6A illustrates a shaft and a pin holder of pivot 118 prior to engagement and FIG. 6B illustrates the shaft being rotatably disposed inside the pin holder. For example, pivot 118 includes a shaft 118-2 protruding from a side surface of base support 118-1. Base support 118-1 can be a supporting arm connected to first rear surface 112-2 of bottom portion 110. Shaft 118-2 protrudes from a side wall of base support 118-1 and is configured to be releasably situated in opening 117-1 of pin holder 117. FIG. 6A illustrates base support 118-1 and shaft 118-2 of bottom portion 110 in close proximity to entry surface 117-2 and opening 117-1 of pin holder 117 of top portion 120. To releasably dispose shaft 118-2 into opening 117-1, a force can be exerted (e.g., by a user) by pushing shaft 118-2 towards and form physical contact with entry surface 117-2. The elasticity of base support 118-1 can be configured such that it allows shaft 118-2 to be further pushed (e.g., by a user) into opening 117-1. Shaft 118-2 can then be disposed into opening 117-1 and secured by the surrounding interior walls of opening 117-1. In some embodiments, a greater elasticity can also reduce the force needed for pushing shaft 118-2 into opening 117-1.

As illustrated in FIGS. 7A-7B, pivot 116 includes pivot 118 and pin holder 117. Entry surface 117-2 of pin holder 117 is configured to guide shaft 118-2 into opening 117-1. For example, entry surface 117-2 can be at a non-perpendicular angle φ with reference to second rear wall 122-2. In some embodiments, non-perpendicular angle φ can be in a range from about 95° to about 170°. For example, non-perpendicular angle φ can be from about 95° to about 140° or from about 140° to about 170°. A greater non-perpendicular angle φ can reduce the force needed for pushing shaft 118-2 into opening 117-1. Shaft 118-2 protrudes from a base support 118-1. In some embodiments, shaft 118-2 can have a length L1 measured along a y-axis and in a range between about 1.5 mm and 1.9 mm. For example, length L1 can be between about 1.5 mm and about 1.6 mm, between about 1.6 mm and about 1.7 mm, between about 1.7 mm and about 1.8 mm, or between about 1.8 mm and 1.9 mm. In some embodiments, L1 can be about 1.7 mm. In some embodiments, shaft 118-2 can have a width L2 measured along an x-axis and in a range between about 1.35 mm and about 1.65 mm. For example, length L2 can be between about 1.35 mm and about 1.55 mm or between 1.55 mm and 1.65 mm. In some embodiments, length L2 can be about 1.5 mm. In some embodiments, a ratio of L1 over L2 can be between about 0.9 and about 1.4. For example, the ratio can be between about 0.9 and about 1.1, between about 1.1 and about 1.2, and between about 1.2 and about 1.4. In some embodiments, the ratio can be about 1.3. A lower ratio of L1 to L2 can provide a more secure fit of shaft 118 within opening 117-1.

In some embodiments, shaft 118-2 can have any suitable non-rectangular shapes such that it can be easily inserted into opening 117-1. For example, shaft 118-2 can have a cross-sectional shape that includes two or more surfaces that are non-perpendicular to sidewall surfaces of base support 118-1. For example, first surface 118-2A of shaft 118-2 can be at a non-perpendicular angle α with reference to sidewall 118-1A of base support 118-1. In some embodiments, non-perpendicular angle α can be in a range between about 95° and about 170°. For example, non-perpendicular angle α can be between about 95° and about 140° or between about 140° and about 170°. Similar to non-perpendicular angle φ described above, a greater non-perpendicular angle α can reduce the force needed for pushing shaft 118-2 into opening 117-1. First surface 118-2A can have a length L3 measured along the x-axis that is in a range of about 1.1 mm to about 1.3 mm. For example, length L3 can be about 1.24 mm. In some embodiments, shaft 118-2 can further include a second surface 118-2B connected to first surface 118-2A, and an angle β between first and second surfaces 118-2A and 118-2B can be in a range from about 0° to about 225°. A length L4 of second surface 118-2B measured along the y-axis can be in a range between about 0.3 mm and about 0.4 mm. For example, length L4 can be about 0.4 mm. A third surface 118-2C is connected to second surface 118-2B and can be substantially in parallel with sidewall 118-1A of base support 118-1. A length L5 of third surface 118-2C measured along the y-axis can be in a range between about 0.6 mm and about 1.0 mm. For example, length L5 can be about 0.8 mm. In some embodiments, fourth surface 118-2D is between third surface 118-2C and sidewall 118-1A. In some embodiments, fourth surface 118-2D can be substantially perpendicular to sidewall 118-1A of base support 118-1.

FIG. 8A-8B are various views of an apparatus that includes a storage medium for wireless communication devices, according to some embodiments. Structures illustrated in FIGS. 8A-8B that are similar to those illustrated in FIGS. 4A-4C may use the same numerals for ease of explanation; however, this repetition does not in itself dictate a relationship between the various embodiments and/or configurations discussed. FIG. 8A illustrates an apparatus 800 that includes a storage medium 802 for storing wireless communication devices 810 such as, for example, a radio-frequency identification (RFID) device. In some embodiments, storage medium 802 can be positioned near or at a rear end of apparatus 800, as illustrated in FIG. 8A. In some embodiments, storage medium 802 can be positioned at any suitable location within apparatus 800, such as walls 112-1, 112-2, 112-3, and 112-4 of apparatus 100 illustrated in FIG. 2A above. Storage medium 802 can be used to store wireless communication device 810 that can include quick response (QR) code for storing information, such as identification of samples inside apparatus 800. In some embodiments, wireless communication device 810 can include electrically stored information of the one or more semiconductor samples stored in apparatus 800 such as their quantity, weight, fabrication process, history record, and any other suitable information. In some embodiments, wireless communication device 810 can be an RFID device that uses electromagnetic fields to automatically identify and track tags or devices attached to apparatus 800. In some embodiments, wireless communication device 810 can include passive tags or devices that collect energy from a nearby RFID reader's interrogating radio waves. In some embodiments, wireless communication device 810 can be active tags that includes a local power source, such as a battery, and can operate at hundreds of meters (for example) from the RFID reader. A receiver, such as a computer or reading device, can be used to record and track the information transmitted from the wireless communication device 810. FIG. 8B is a perspective view that illustrates a cross section of apparatus 800. As illustrated in FIG. 8B, apparatus 800 also includes a groove 804 and one or more clips 822 that can be configured to contour the shape of wireless communication device 810 such that wireless communication device 810 can be securely and releasably positioned in storage medium 802.

FIGS. 9A-9C are various views of padding used in apparatus to securely hold one or more semiconductor samples having various sizes, according to some embodiments. As illustrated in FIGS. 9A-9C, padding 900 includes a base 902 and various trenches 904 formed therein. Trenches 904 can have a depth d into base 902 that can be configured based on thicknesses of semiconductor samples. In some embodiments, depth d can be in a range from about 0.1 mm to about 100 mm. In some embodiments, trenches 904 can have a width $w_T$ that is between about 1 mm to about 100 mm and a length LT that is between about 1 mm and 100 mm. In some embodiments, base 902 can be formed using any suitable material such as, for example, silicone material, sponge material, and combinations thereof. Silicone and sponge material can provide, among other things, benefits of (i) not leaving any glue residue on rear side of semiconductor devices after the semiconductor devices are removed from base 902; (ii) free of volatile organic compounds (VOCs); (iii) high recyclability (e.g., used multiple times); and (iv) compliant with Restriction of Hazardous Substances Directive (RoHS). In some embodiments, silicone material and sponge material can reduce any external vibrations experienced by the apparatus such that the semiconductor samples stored within the apparatus can experience reduced vibration which in turn protects the stored samples.

Figure 10:
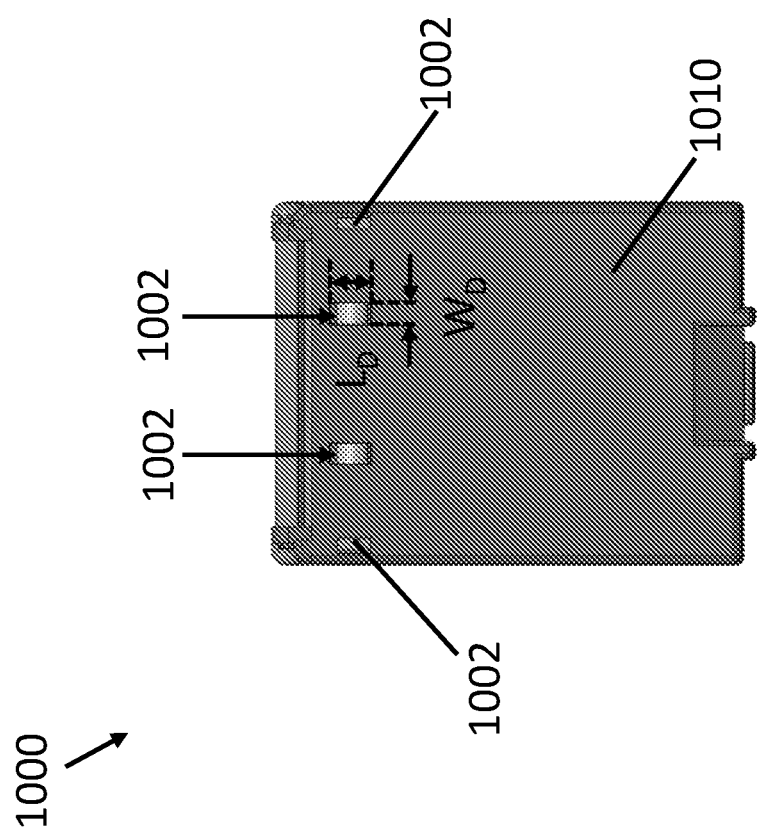
FIG. 10 is a bottom view of an apparatus in a closed container configuration, according to some embodiments.

FIG. 10 is a bottom view of an apparatus that includes openings formed in its bottom portion, according to some embodiments. As shown in FIG. 10, a plurality of openings 1002 can be formed at the bottom surface of bottom portion 1010 of apparatus 1000. Apparatus 1000 and bottom portion 1010 can be respectively similar to apparatus 100 and bottom portion 110 illustrated in FIGS. 1A-1D, and would not be described in detail here for simplicity. In some embodiments, openings 1002 can be used as drainage holes to facilitate removal of cleaning solution during cleaning processes performed on apparatus 1000. In some embodiments, openings 1002 can be used as means for releasing chemicals in the event of chemical contamination within apparatus 1000. In some embodiments, openings 1002 can be formed at any suitable locations on bottom portion 1010. In some embodiments, openings 1002 can have a width $W_D$ that is in a range between about 3 mm and about 7 mm, and a length $L_D$ that is in a range between about 3 mm and about 15 mm. In some embodiments, at least one or more openings 1002 are formed in bottom wall 1010 and under the storage medium for wireless communication devices, thus exposing a portion of the storage medium. Therefore, the at least one or more openings 1002 can also be used as a view port to determine (e.g., by a user) whether a wireless communication device is stored in the storage medium without having to open apparatus 1000.

Figure 11:
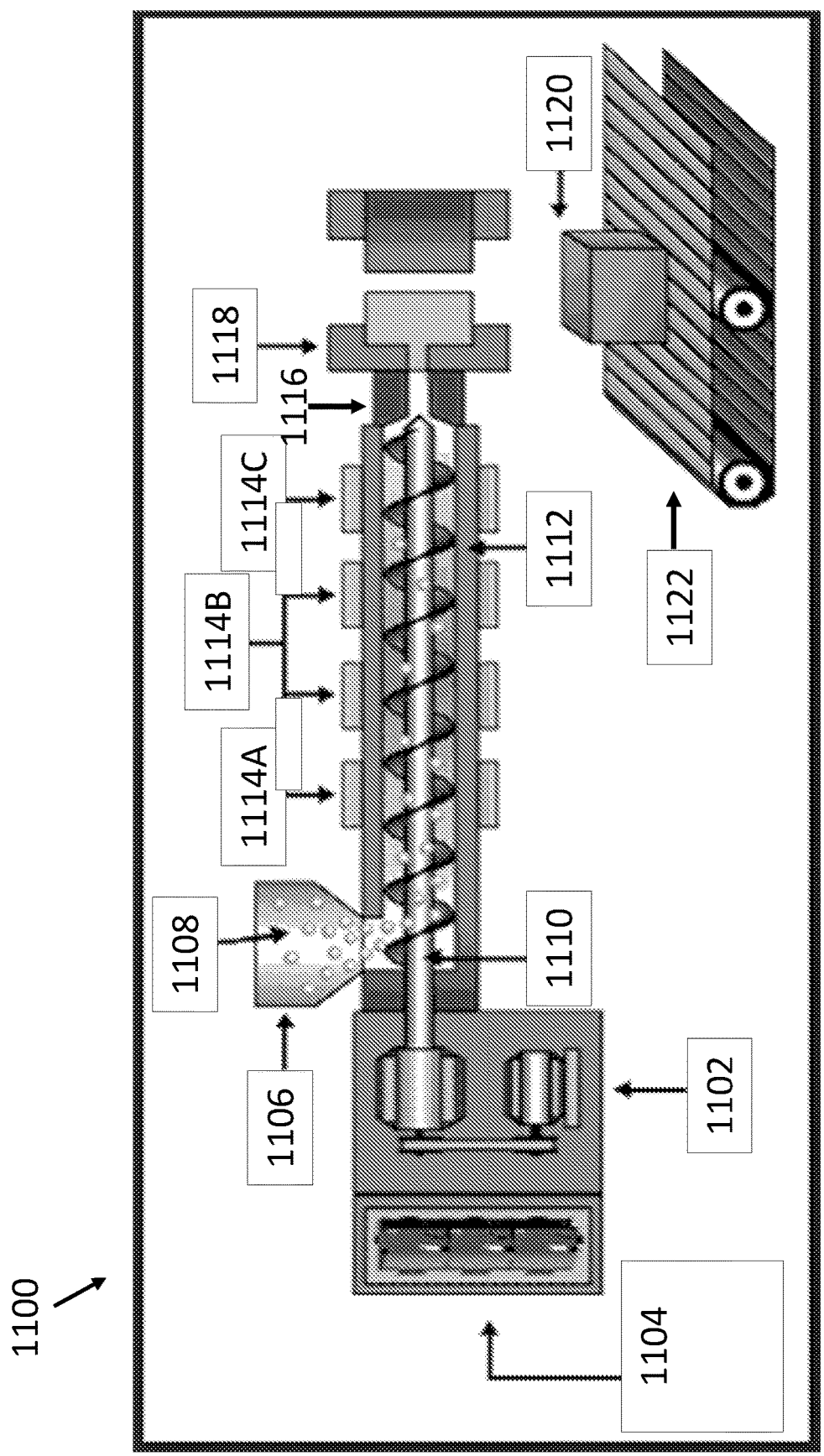
FIG. 11 is a mold injection apparatus for forming an apparatus, according to some embodiments.

FIG. 11 illustrates an exemplary mold injection apparatus, according to some embodiments. Mold injection apparatus 1100 illustrated in FIG. 11 includes motor 1102, controller 1104, hopper 1106, reciprocating screw 1110, barrel 1112, front heaters 1114A, middle heaters 1114B, rear heaters 1114C, nozzle 1116, and mold 1118. Other structures can also be included in FIG. 11 but are not illustrated for simplicity. Reciprocating screw 1110 extends along the longitudinal axis of barrel 1112 and is driven by motor 1102. Controller 1104 is configured to control the motions of motor 1102. For example, controller 1104 can start, stop, and adjust the power of motor 1102 which in turn determines the start, stop, and rotational speed of reciprocating screw 1110. Front heaters 1114A are configured to heat up a front portion of barrel 1112 to a nominal temperature for a nominal period of time. Similarly, middle heaters 1114B are configured to heat up a middle portion of barrel 1112 and rear heaters 1114C are configured to heat up a rear portion of barrel 1112, both heaters providing heating capability at a nominal temperature for a nominal period of time. Pellets 1108 can be pre-heated to a nominal temperature and provided to barrel 1112 through hopper 1108. In some embodiments, pellets 1108 can be polycarbonate resin in the molten state. In some embodiments, pellets 1108 can be polycarbonate resin in the solid state, and converts into molten state in barrel 1112. Reciprocating screw 1110 pushes pellets 1108 through barrel 1112 including the front, middle, and rear portions of barrel 1112. As pellets 1108 move through barrel 1112, they are heated by front, middle, and rear heaters 1114A-C respectively and eventually pushed through nozzle 1116 into mold 1118. Mold 1118 compresses heated pellets 1108 such that the heated pellets 1108 coagulates and forms product 1120. In some embodiments, product 1120 can be structures of upper and lower portions of a semiconductor carrier. Product 1120 can be transferred to other fabrication facility such as a cooling tank via belt 1122.

Figure 12:
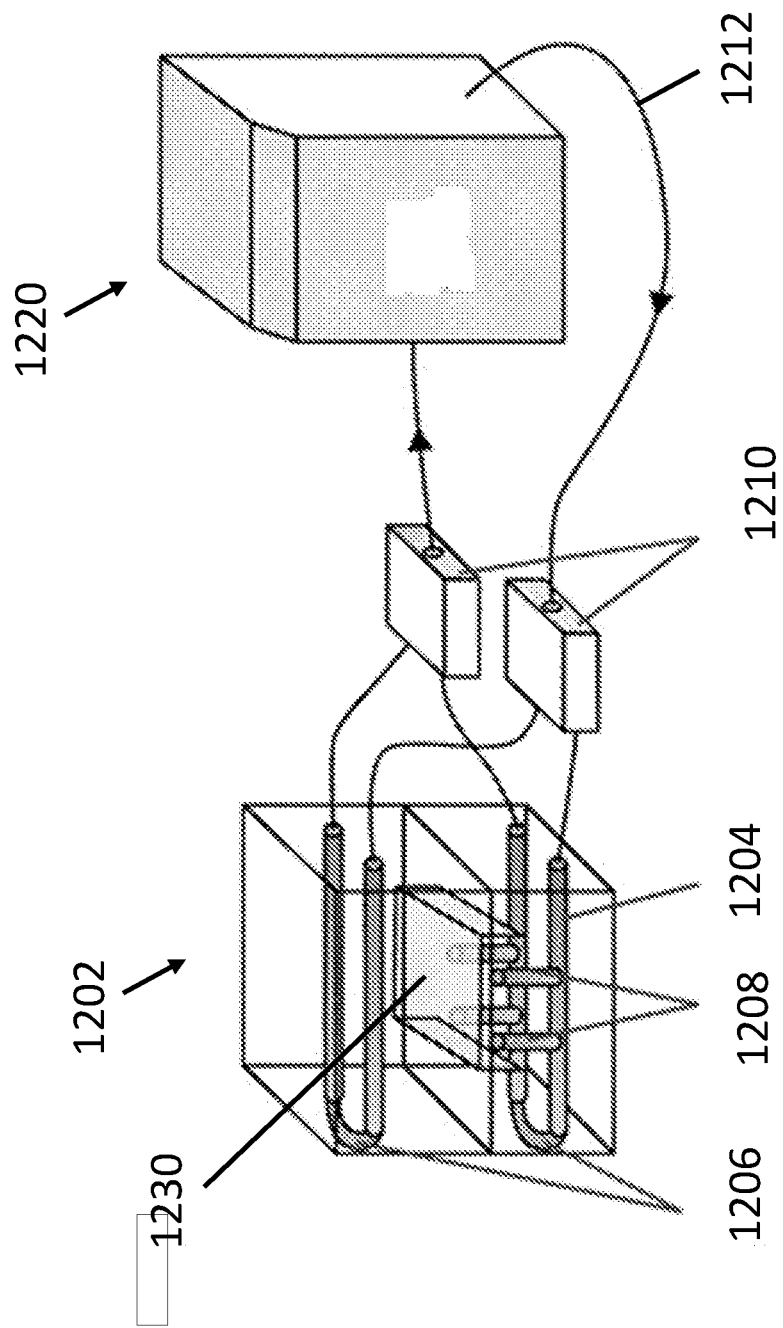
FIG. 12 is a cooling system for cooling an apparatus, according to some embodiments.

FIG. 12 illustrates an exemplary cooling system, according to some embodiments. The cooling system includes a cooling tank 1202 and a temperature controller 1220 coupled to cooling tank 1202 through tubes. In some embodiments, cooling tank 1202 can include tubes 1204, hoses 1206 connected to ends of tubes 1204, waterway baffle 1208, and branch tubes 1210. Other components of the cooling system may be included and are not illustrated for simplicity. Cooling tank 1202 can be filled with water and a liquid coolant can be circulated in cooling tank 1202 through tubes 1204 and hoses 1206, and the temperature of the liquid coolant can be regulated by temperature controller 1220. For example, liquid coolant having a nominal temperature can exit temperature controller 1220 and enter one or more branch tubes 1210 which can connect to one or more tubes 1204. The liquid coolant circulates through cooling tank 1202 and returns to temperature controller 1220 through another one of branch tubes 1210. Waterway baffle 1208 can be controlled by temperature controller 1220 to adjust the flow rate of coolant in cooling tank 1202. Such configuration allows accurate control of the coolant temperature. For example, the coolant temperature can be adjusted to and hold at temperatures between about 5° C. and about 90° C. which is also the temperature of water within cooling tank 1202. Devices 1230 such as an upper or lower portion of a semiconductor carrier can be placed in cooling tank 1202 such that the temperature of the device can be gradually cooled down to a nominal temperature. For example, device 1230 having initial temperature of about 130° C. can be placed into cooling tank 1202 having initial coolant temperature of about 70° C. Temperature controller 1220 can adjust coolant temperature to reduce gradually until room temperature over a period of time, such as about 15 min. Therefore, the temperature of device 1230 can be reduced gradually to room temperature through heat exchange with the coolant.

Figure 13:
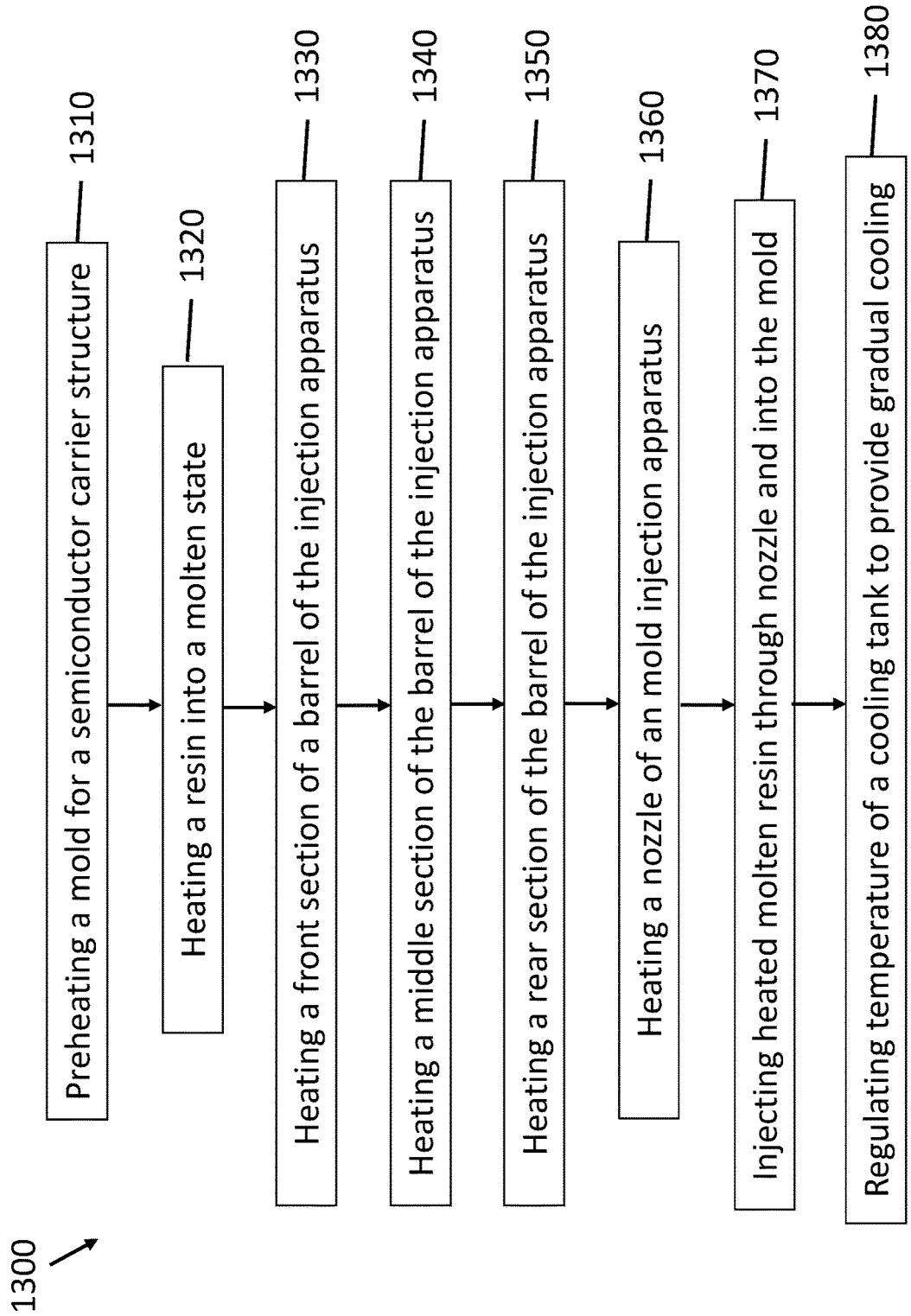
FIG. 13 is a flow chart of forming an apparatus for transporting semiconductor elements, according to some embodiments.

FIG. 13 is a flow chart of method 1300, which describes a method for forming top and bottom portions of an apparatus (e.g., semiconductor die carrier apparatus), according to some embodiments. In some embodiments, method 1300 describes forming top and bottom portions by mold injection of polycarbonate and any suitable plastics. Polycarbonate can be a colorless and transparent amorphous thermoplastic material.

Top and bottom portions of the apparatus formed using method 1300 can exhibit exceptional electrical and physical properties. For example, top and bottom portions can exhibit electrostatic charge resistibility due to high electrical resistance. In some embodiments, high electrical resistance can be determined by applying an electrical voltage on various portions of the top and bottom portions of the apparatus and measuring the generated electrical current. For example, voltages ranging from about 10V to about 300V applied to the apparatus (e.g., about 10V to 300V and ground—or 0V—applied to areas on the top or bottom portion using electrical resistance probing systems) can generate electrical current of about 5 µA, which is negligible for a semiconductor element carrier.

In some embodiments, top and bottom portions also exhibit high chemical resistance due to low reaction rate to various acids and alkalis. In addition, top and bottom portions also maintains high structural integrity under various temperatures (e.g., from about 15° C. to about 35° C.) and various humidity levels (e.g., relative humidity from 25% to about 75%). In some embodiments, top and bottom portions formed using poly carbonate can provide the benefits of, among other things, heat resistant (e.g., up to 120° C.), impact resistant, flame retardant without additives, shock proof, and high refractive index.

This disclosure is not limited to this operational description of method 1300. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 13. In some implementations, one or more other operations may be performed in addition to or in place of the presently described operations. For illustrative purposes, method 1300 is described to form top and bottom portions illustrated in FIGS. 1A-8B, however, method 1300 is not limited to these embodiments.

Method 1300 begins with operation 1310, where a mold for forming top and bottom portions is heated, according to some embodiments. In some embodiments, a mold can be a hollow container containing a cavity configured to provide a shape to molten or hot resin material when it cools and hardens. In some embodiments, the cavity can be configured to contour a nominal shape of a top portion or a bottom portion of a semiconductor die carrier apparatus. Examples of top and bottom portions can be top and bottom portions 120 and 110 described above in FIGS. 1A-8A. The heating process of the mold can be performed using any suitable heating method, such as plasma heating, infra-red heating, lamp heating, rapid annealing, traditional baking, other suitable annealing methods, and/or combinations thereof. In some embodiments, the mold is heated to a low temperature between about 50° C. and about 90° C. For example, the mold can be heated to a temperature between about 50° C. and about 70° C. In some embodiments, the mold can be heated to a lower temperature between about 30° C. and about 70° C. In some embodiments, the heating process can be performed for a time period between about 10 min and about 30 min. In some embodiments, the heating process can be performed using multiple heating steps performed at various temperatures. For example, the mold can be heated at a first temperature of about 50° C. for about 10 min, gradually increasing the temperature to about 70° C. for about 10 min, and gradually increasing the temperature to about 90° C. for about 10 min. In some embodiments, the mold can be heated at a first temperature of about 50° C. for about 5 min, gradually increasing the heating temperature to about 60° C. for about 10 min, and gradually increasing the temperature to about 75° C. for about 25 min. In some embodiments, the heating process can be a single-step heating process. For example, the mold can be heated at about 70° C. for about 20 min. The low heating temperature and short heating time can provide the benefit of reducing particle and stable fluidity.

In operation 1320 of method 1300, a resin is heated into a molten state, according to some embodiments. In some embodiments, a polycarbonate resin can be used to form top or bottom portions of the apparatus. Polycarbonate resin can be a colorless and transparent amorphous thermoplastic material in a solid state at room temperature. In some embodiments, polycarbonate resin can include any suitable primary material, such as bisphenol A-phosgenepolymer 2, 2-bis (4-Hydroxyphenyl) propane, polycarbonate lexan, poly isopropylidene diphenyl carbonate, poly oxycarbonyloxy-1, 4-phenylene(1-methylethylidene)-1,4-phenylene) Poly oxycarbonyloxy-1, 4-phenylene(1-methylethylidene)-1,4-phenylene, Poly-4, 4'-isopropylidenediphenylcarbonate), polycarbonate pc, and any other suitable polycarbonate composites. Polycarbonate material can be added as additives to the primary material according to a nominal proportion. Specifically, the resin can include a nominal volume ratio of the primary material and the polycarbonate additive. For example, the primary material can make up about 99% of the resin while the polycarbonate additive is about 1% of the resin. In some embodiments, the primary material can make up greater or equal to about 55% of the resin material. For example, the primary material can make up about 55%, 60%, 65%, 70%, 75%, 80%, 85%, 90%, 95%, and 99% of the resin material, and the polycarbonate additives can form the remaining proportions of the resin, respectively. The heating temperature for converting resin from a solid state to a molten state can be in a range of about 110° C. to about 170° C. In some embodiments, depending on the composition of the resin, the heating temperature can be between about 110° C. and about 135° C. A heating process is used to provide sufficient thermal energy to induce a thermal transition of resin from a solid state to a molten state and can use any suitable heating method, such as plasma heating, infra-red heating, lamp heating, rapid annealing, traditional baking, other suitable heating methods, and/or combinations thereof. In some embodiments, the heating process can be a single-step heating process. In some embodiments, the heating process can be performed for a time period between about 2 hours and about 4.5 hours. In some embodiments, the temperature for a single-step heating process can be performed at about 150° C. for about 4.5 hours. In some embodiments, the heating process can be performed at about 170° C. for about 2 hours. In some embodiments, the temperature can be any other suitable temperature, such as 110° C., 130° C., 150° C., 170° C., or any other suitable temperature. The heating process can include multiple heating steps at various temperatures, in accordance with some embodiments. For example, the multiple heating steps can include heating steps performed at temperatures of about 130° C., 140° C., 150° C., 160° C., 170° C., or any other suitable temperature. For example, the resin can be heated at a first temperature of about 110° C. for about 30 min, gradually increasing the heating temperature to about 120° C. for about 60 min, and gradually increasing the temperature to about 135° C. for about 120 min. The heating time and temperature can be determined by the temperature and humidity of the environment. For example, processing temperature can vary from about 22° C. to about 37° C., and humidity level can vary from 30% relative humidity ("RH") to about 85% RH. In some embodiments, a greater processing temperature and/or a greater humidity level may call for a greater heating temperature and/or heating time. However, heating temperatures above 170° C. and heating times greater than 4.5 hours under normal circumstances (e.g., at room temperature and 50% relative humidity level) may cause material degradation and reduce electrical and mechanical properties of the top or bottom portions. In some embodiments, the heating time can be adjusted based on ambient environment. For example, when the temperature and humidity levels are elevated, the heating time can be adjusted to between about 4.5 hours and about 12 hours to avoid hue changes and rubble particle formation in the resin. In some embodiments, a heating time greater than 12 hours may cause irreversible damage to the polycarbonate material and cause it to lose desirable electrical and mechanical properties, such as high electrical and heat resistivity. In some embodiments, the heating process can also include pre-heating steps, stable heating steps, cooling steps, other suitable steps, and/or combinations thereof. The resin in molten state can undergo further heating processes in the mold injection apparatus prior to being dispensed by a nozzle.

In operation 1330 of method 1300, a front section of a barrel of the injection apparatus is heated, according to some embodiments. For example, resin can be heated to a temperature between about 170° C. and about 260° C. in a front section of the barrel. In some embodiments, the temperature of the front section can be heated to between about 155° C. and about 285° C. In some embodiments, resin can be heated to temperatures such as, for example, 170° C., 180° C., 190° C., 200° C., 210° C., 220° C., 230° C., 240° C., 250° C., 260° C., or any other suitable temperature. The heating process can include multiple heating steps at various temperatures, in accordance with some embodiments. For example, the multiple heating steps can include heating steps performed at increasing temperatures of about 180° C., 200° C., 240° C., and 260° C. As a further example, the resin can be heated at a first temperature of about 180° C. for about 2 min, gradually increasing the heating temperature to about 220° C. for about 2 min, and gradually increasing the temperature to about 240° C. for about 1 min. In some embodiments, the resin can be heated in the front section for about 1 min and 5 min. The heating time and temperature can be determined by the temperature and humidity of the environment. Examples of a front section of a barrel can be the portion of barrel 1114 heated by one or more heaters 1114A illustrated in FIG. 11.

In operation 1340 of method 1300, a middle section of a barrel of the injection apparatus is heated, according to some embodiments. For example, resin can be heated to a temperature between about 210° C. and about 280° C. in a middle section of the barrel. In some embodiments, the temperature of the middle section can be heated to between about 205° C. and about 290° C. In some embodiments, resin can be heated to temperatures such as, for example, 210° C., 220° C., 230° C., 240° C., 250° C., 260° C., 270° C., 280° C., or any other suitable temperature. The heating process can include multiple heating steps at various temperatures, in accordance with some embodiments. For example, the multiple heating steps can include heating steps performed at increasing temperatures of about 220° C., 250° C., and 270° C. As a further example, the resin can be heated at a first temperature of about 210° C. for about 1 min, gradually increasing the heating temperature to about 240° C. for about 2 min, and gradually increasing the temperature to about 260° C. for about 0.5 min. In some embodiments, the resin can be heated in the middle section for about 1 min and 5 min. The heating time and temperature can be determined by the temperature and humidity of the environment. Examples of a middle section of a barrel can be the portion of barrel 1114 heated by one or more heaters 1114B illustrated in FIG. 11.

In operation 1350 of method 1300, a rear section of a barrel of the injection apparatus is heated, according to some embodiments. For example, resin can be heated to a temperature between about 220° C. and about 280° C. in a rear section of the barrel. In some embodiments, the temperature of the rear section can be heated to between about 220° C. and about 320° C. In some embodiments, resin can be heated to temperatures such as, for example, 220° C., 230° C., 240° C., 250° C., 260° C., 270° C., 280° C., or any other suitable temperature. The heating process can include multiple heating steps at various temperatures, in accordance with some embodiments. For example, the multiple heating steps can include heating steps performed at increasing temperatures of about 230° C., 250° C., and 270° C. As a further example, the resin can be heated at a first temperature of about 230° C. for about 1 min, gradually increasing the heating temperature to about 250° C. for about 1 min, and gradually increasing the temperature to about 270° C. for about 2 min. In some embodiments, the resin can be heated in the rear section for about 1 min and 5 min. The heating time and temperature can be determined by the temperature and humidity of the environment. Examples of a rear section of a barrel can be the portion of barrel 1114 heated by one or more heaters 1114C illustrated in FIG. 11.

In operation 1360 of method 1300, a nozzle of a mold injection apparatus is heated, according to some embodiments. The heating process of the nozzle can be performed using any suitable heating method, such as plasma heating, infra-red heating, lamp heating, rapid annealing, traditional baking, other suitable annealing methods, and/or combinations thereof. In some embodiments, the nozzle is heated to a temperature between about 170° C. and about 280° C. In some embodiments, the heating process can be performed for a time period between about 1 min and about 5 min. In some embodiments, the heating process can be performed using multiple heating steps performed at various temperatures. For example, the mold can be heated at a first temperature of about 170° C. for about 1 min, gradually increasing the heating temperature to about 230° C. for about 2 min, and gradually increasing the temperature to about 280° C. for about 2 min. In some embodiments, the heating process can be a single-step heating process. For example, the nozzle can be heated at about 200° C. for about 3 min. Examples of a nozzle can be nozzle 1118 illustrated in FIG. 11.

In operation 1370 of method 1300, the heated resin in the molten state is pushed through a nozzle and into a mold, according to some embodiments. Heated resin produced by moving the resin through various portions of a barrel of a mold injection apparatus is dispensed through the nozzle of the mold injection apparatus and into and fills the cavity of the pre-heated mold. The mold then applies pressure to the injected resin by compressing the heated resin. After a pre-determined period of time (e.g., 5-10 min), the heated resin coagulates from a molten state into a solid state that has a tangible shape contouring the interior shape of the mold cavity. The solid structure can be an upper or lower portion of the semiconductor carrier structure. The mold then releases the upper or lower portion of the semiconductor carrier structure. Examples of the mold and portions of the semiconductor carrier structure can respectively be mold 1116 and product 1120 illustrated in FIG. 11.

In operation 1380 of method 1300, the upper or lower portion of the semiconductor carrier structure is moved from the mold injection apparatus and gradually cooled down in a cooling tank, according to some embodiments. The cooling tank can include hoses, waterway, tubes, and controlling mechanisms such as temperature sensors and controllers. The cooling tank can circulate thermal liquid coolants such as water and include any other suitable structures for providing a gradual cooling effect. In some embodiments, upper or lower portion of the semiconductor carrier structure is cooled from about 150° C. to about room temperature (e.g., 23° C.) in about 2-5 min in the cooling tank. An example of the cooling tank can be cooling tank 1202 described above in FIG. 12.

The present disclosure describes an apparatus for storing and transporting semiconductor elements and a method for forming the same. In some embodiments, the apparatus is a semiconductor die carrier that includes a locking mechanism, such as a latch positioned between two adjacent bumpers protruding from a front surface of the closed semiconductor die carrier. In some embodiments, the semiconductor die carrier can include a pair of partially-recessed pivotal structures positioned at a rear surface of the semiconductor die carrier opposing the latch. In some embodiments, the semiconductor die carrier can include one or more slots within the enclosed space formed by the top and bottom portions of the apparatus. The slots can include two or more grooves configured to securely hold one or more wireless communication devices. In some embodiments, the semiconductor die carrier can include silicone pad and sponges positioned in the bottom portion of the semiconductor die carrier for holding semiconductor dies having various sizes. In some embodiments, the semiconductor die carrier can include openings such as drain holes at the bottom portion to facilitate easy cleaning of the semiconductor die carrier. In some embodiments, the top and bottom portions of the semiconductor die carrier can be formed using polycarbonate that reduces the release of chemical contamination into the enclosed space and provides improved electrical and mechanical properties of the semiconductor die carrier. In some embodiments, the semiconductor carrier structure can also include imprinted barcodes (e.g., two-dimensional matrix barcodes) on the exterior to enable easy read of the information. In some embodiments, the top and bottom portions of the semiconductor die carrier is formed by polycarbonate composites using injection molding. The semiconductor die carrier formed using polycarbonate can exhibit exceptional electrical and physical properties. In some embodiments, top and bottom portions also exhibit high chemical resistance due to low reaction rate to various acids and alkalis. In addition, top and bottom portions also maintains high structure integrity under various temperatures and humidity levels. In some embodiments, top and bottom portions formed using poly carbonate can provide the benefits of, among other things, heat resistant (e.g., up to 120° C.), impact resistant, flame retardant without additives, shock proof, and high refractive index.

In some embodiments, an apparatus includes a first portion including a first front wall, a first rear wall, a bottom wall integrally coupled to the first front wall and the first rear wall, and at least one pivotal pin structure integrally coupled to and extending from the first rear wall. The apparatus also includes a second portion having a second front wall, a second rear wall, a top wall integrally coupled to the second front wall and the second rear wall, and at least one pin holder integrally coupled to and extending from the second rear wall and at an offset angle with reference to the top wall. The at least one pivotal pin structure includes a base support connected to the first rear wall and a shaft connected to the base support, and the at least one pin holder defines an opening sized and shaped to accept the shaft. The first portion and the second portion are sized and shaped to be pivotally movable between an open configuration and a closed configuration.

In some embodiments, an apparatus for transporting semiconductor elements includes a first portion having comprising a first front wall, a first rear wall, a bottom wall integrally coupled to the first front wall and the first rear wall, and at least one pivotal pin structure integrally coupled to and extending from the first rear side wall. The first rear wall is at an offset angle with reference to the top wall. The apparatus also includes a second portion having a second front wall, a second rear wall, a top wall integrally coupled to the second front wall and the second rear wall, and at least one pin holder integrally coupled to and extending from the second rear side wall. The at least one pivotal pin structure includes a base support connected to the first rear wall and a shaft connected to the base support. The at least one pin holder defines an opening sized and shaped to accept the shaft of the at least one pivotal pin structure. The first and second rear walls are in parallel with each other in an open configuration and a closed configuration.

In some embodiments, a method for forming an apparatus for transporting semiconductor elements includes providing a mold, wherein the mold includes a cavity contouring a shape of a top portion or a bottom portion of the apparatus. The method includes heating the mold to a temperature between about 50° C. and about 90° C. The method further includes providing a polycarbonate resin in a solid state and heating the polycarbonate resin to a temperature between about 110° C. and about 135° C. such that the polycarbonate resin converts from the solid state into a molten state. The method also includes flowing the polycarbonate resin through a barrel of a mold injection apparatus, wherein the barrel is heated to a temperature between about 155° C. and about 320° C. The method further includes heating a nozzle of the mold injection apparatus to a temperature between about 190° C. and about 300° C. The method also includes injecting the polycarbonate resin into the mold through the nozzle and gradually cooling the polycarbonate resin to form the top or bottom portions of the apparatus.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method for forming an apparatus for transporting semiconductor elements, comprising:
providing a mold, wherein the mold comprises a cavity contouring a shape of a top portion or a bottom portion of the apparatus, wherein the bottom portion comprises a front wall, a rear wall, a bottom wall coupled to the front wall and the rear wall, and a pivotal pin structure extending from the rear wall and comprising:
a base support connected to the rear wall and comprising a sidewall; and
a shaft protruding from the base support and comprising first, second, third, and fourth side surfaces, wherein the first and fourth side surfaces are connected to the sidewall and the second side surface is connected to the first side surface;
heating the mold to a first temperature;
providing a polycarbonate resin in a solid state;
heating the polycarbonate resin to a second temperature under a humidity level from about 30% relative humidity to about 85% relative humidity, such that the polycarbonate resin converts from the solid state into a molten state;
heating a barrel of a mold injection apparatus to a third temperature greater than the second temperature;
flowing the polycarbonate resin through the barrel;
heating a nozzle of the mold injection apparatus to a fourth temperature;
injecting the polycarbonate resin into the mold through the nozzle to form a solid structure; and
cooling the solid structure to form the top or bottom portions of the apparatus.

2. The method of claim 1, wherein heating the mold comprises heating the mold for a time between about 10 minutes and about 30 minutes, and wherein an angle between the first side surface and the sidewall is between about 95° and about 170°.

3. The method of claim 1, wherein heating the polycarbonate resin comprises heating the polycarbonate resin for a time between about 2 hours and about 4.5 hours.

4. The method of claim 1, wherein the first temperature is between about 50° C. and about 90° C.

5. The method of claim 1, wherein the second temperature is between about 110° C. and about 135° C.

6. The method of claim 1, wherein the third temperature is between about 155° C. and about 320° C.

7. The method of claim 1, wherein the fourth temperature is between about 190° C. and about 300° C.

8. The method of claim 1, wherein cooling the solid structure comprises placing the solid structure in a liquid coolant having a temperature of about 70° C.

9. The method of claim 1, wherein the polycarbonate resin comprises a primary material and an additive, wherein the additive makes up about 1% of the polycarbonate resin.

10. The method of claim 1, wherein heating the polycarbonate resin comprises controlling a processing temperature between about 22° C. to about 37° C.

11. A method for forming an apparatus for transporting semiconductor elements, comprising:
providing a mold, wherein the mold comprises a cavity contouring a shape of a bottom portion of the apparatus, wherein the bottom portion of the apparatus comprises a front wall, a rear wall, a bottom wall coupled to the front wall and the rear wall, and a pivotal pin structure extending from the rear wall and comprising:
a base support connected to the rear wall and comprising a sidewall; and
a shaft protruding from the base support and comprising first, second, third and fourth side surfaces, wherein:
the first and fourth side surfaces are connected to the sidewall;
the second side surface is connected to the first side surface; and
the third side surface is connected to the fourth side surface;
heating the mold to a first temperature;
heating a polycarbonate resin to a second temperature under a humidity level from about 30% relative humidity to about 85% relative humidity to convert such that the polycarbonate resin converts from a solid state into a molten state;
heating a barrel of a mold injection apparatus, comprising:
heating a front portion of the barrel to a third second temperature;
heating a middle portion of the barrel to a fourth third temperature; and
heating a rear portion of the barrel to a fifth temperature using a multiple-step heating process performed at different temperatures and durations;
flowing the polycarbonate resin through the barrel;
injecting the polycarbonate resin into the mold through a nozzle attached to the barrel to form a solid structure; and
cooling the solid structure.

12. The method of claim 11, wherein the third second temperature is between about 155° C. and about 285° C.

13. The method of claim 11, wherein the fourth third temperature is between about 205° C. and about 290° C.

14. The method of claim 11, wherein cooling the solid structure comprises placing the solid structure in a liquid coolant, and wherein a ratio between a length of the shaft and a width of the shaft is between about 0.9 and about 1.4, and wherein:
the length is measured along a direction parallel to the sidewall, and
the width is measured along a direction perpendicular to the sidewall.

15. The method of claim 14, wherein the liquid coolant is cooled from an initial temperature of about 70° C. to about room temperature over a duration of about 15 min.

16. The method of claim 11, wherein the polycarbonate resin comprises a primary material and an additive, wherein the primary material makes up about 55% to about 99% of the polycarbonate resin.

17. The method of claim 11, wherein heating the polycarbonate resin comprises:
heating the polycarbonate resin at a temperature of about 110° C. for about 30 min;
after the about 30 min, heating the polycarbonate resin at a temperature of about 120° C. for about 60 min; and
after the about 60 min, heating the polycarbonate resin at a temperature of about 135° C. for about 120 min.

18. The method of claim 11, wherein heating the polycarbonate resin comprises controlling a processing temperature between about 22° C. and about 37° C.

19. A method for manufacturing an apparatus for transporting semiconductor elements, comprising:
providing a mold, wherein the mold comprises a cavity contouring a shape of a bottom portion of the apparatus, wherein the bottom portion of the apparatus comprises a front wall, a rear wall, a bottom wall coupled to the front wall and the rear wall, and a pivotal pin structure comprising:
  a base support connected to the rear wall and comprising a sidewall; and
  a shaft protruding from the base support and comprising first, second, third and fourth side surfaces, wherein:
    the first and fourth side surfaces are connected to the sidewall; and
    the first and second side surfaces are connected at an angle greater than 90°;
heating the mold to a first temperature;
heating a polycarbonate resin to a second temperature under an environmental temperature between about 22° C. to about 37° C., such that the polycarbonate resin converts from a solid state into a molten state;
heating a barrel of a mold injection apparatus;
flowing the polycarbonate resin through the barrel;
injecting the polycarbonate resin into the mold through a nozzle attached to the barrel to form a solid structure;
cooling the solid structure; and
imprinting at least one identifying code on at least one exterior surface of the solid structure.

20. The method of claim 19, wherein heating the polycarbonate resin comprises controlling a humidity level from about 30% relative humidity to about 85% relative humidity.

* * * * *

UNITED STATES PATENT AND TRADEMARK OFFICE
CERTIFICATE OF CORRECTION

PATENT NO. : 11,881,421 B2  
APPLICATION NO. : 17/216247  
DATED : January 23, 2024  
INVENTOR(S) : Tsai et al.

Page 1 of 1

It is certified that error appears in the above-identified patent and that said Letters Patent is hereby corrected as shown below:

In the Claims

In Column 18, Claim 11, Line 27, before "second", delete "third".

In Column 18, Claim 11, Line 29, before "third", delete "fourth".

In Column 18, Claim 12, Line 40, before "second", delete "third".

In Column 18, Claim 13, Line 42, before "third" delete "fourth".

In Column 18, Claim 14, Line 50, delete "sidewall," and insert -- sidewall; --, therefor.

Signed and Sealed this  
Twenty-third Day of April, 2024

Katherine Kelly Vidal  
*Director of the United States Patent and Trademark Office*